(12) United States Patent
Van Vaals et al.

(10) Patent No.: US 6,731,969 B2
(45) Date of Patent: May 4, 2004

(54) MAGNETIC RESONANCE METHOD, APPARATUS AND COMPUTER PROGRAM PRODUCT

(75) Inventors: Johannes Jacobus Van Vaals, Eindhoven (NL); Frederik Visser, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 197 days.

(21) Appl. No.: 09/966,402

(22) Filed: Sep. 28, 2001

(65) Prior Publication Data

US 2002/0055676 A1 May 9, 2002

(30) Foreign Application Priority Data

Oct. 2, 2000 (EP) .............................................. 00203397

(51) Int. Cl.[7] .............................................. A61B 5/055
(52) U.S. Cl. ........................................ 600/410; 600/424
(58) Field of Search ................................ 600/410, 411, 600/420, 421, 422, 423, 424; 324/307, 309

(56) References Cited

U.S. PATENT DOCUMENTS

| | | | |
|---|---|---|---|
| 5,792,055 A | * | 8/1998 | McKinnon ................... 600/410 |
| 5,928,148 A | | 7/1999 | Wang ........................... 600/420 |
| 5,944,023 A | * | 8/1999 | Johnson et al. .............. 128/899 |
| 6,014,580 A | * | 1/2000 | Blume et al. ................ 600/424 |
| 6,516,213 B1 | * | 2/2003 | Nevo ........................... 600/424 |
| 6,529,766 B1 | * | 3/2003 | Guendel ...................... 600/427 |

FOREIGN PATENT DOCUMENTS

| WO | WO9927382 | 6/1999 | ......... G01R/33/563 |
|---|---|---|---|

* cited by examiner

Primary Examiner—Eleni Mantis Mercader
(74) Attorney, Agent, or Firm—John Vodopia

(57) ABSTRACT

A magnetic resonance method for forming a fast dynamic image from a plurality of signals of an RF probe is described. The RF probe is moved relative to an object to be imaged so as to acquire at least two adjacent Fields-of-View (FOV) which are reconstructed so as to form an image of a region of interest which includes both FOVs. The object to be imaged is scanned by a moving RF antenna. Furthermore, the first FOV is centered at the initial probe position and after each subsequent scan the position of the imaging field within the actual FOV is determined. From that data the next position of the RF probe relative to the object is computed and, if the imaging field runs out of the actual FOV, the RF antenna is moved to the estimated next position of the RF probe so that the subsequent FOV is centered again at the RF probe position. A composite image is then generated from the successive images of the various adjacent FOVs.

6 Claims, 2 Drawing Sheets

MAGNETIC RESONANCE METHOD, APPARATUS AND COMPUTER PROGRAM PRODUCT

Figure 1:
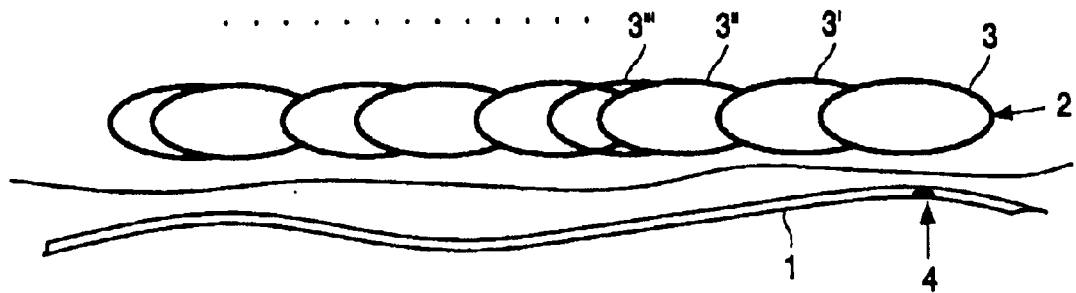

The invention relates to a magnetic resonance method for forming a fast dynamic image from a plurality of signals from an RF probe according to the preamble of claim 1. The invention also relates to a magnetic resonance imaging apparatus for obtaining a fast dynamic image according to the preamble of claim 1 and to a computer program product according to the preamble of claim 6.

In U.S. Pat. No. 5,928,148 data is acquired from a large region of interest in magnetic resonance angiography (MRA) by translating the patient to successive stations at which successive portions of the MRA data set are acquired. The patient is moved to three successive locations between the RF coils of the MRI system by translation of the patient table. The patient movement is chosen to track a bolus of contrast agent as it passes through the region of interest so as to achieve maximum image contrast. In one embodiment a stationary local coil is supported adjacent the patient to acquire the MRA data and in another embodiment a multi-segment local coil moves with the patient and its segments are sequentially switched into operation.

In a further patent application of the same inventors, that is, WO-A-99/27382 which concerns a further development of the same acquisition method, it is mentioned that the successive acquisition at each Field of View (FOV) may not be fast enough to track with the bolus of contrast agent as it passes through successive FOVs. For example, it may require nearly 50 seconds to acquire 3D NMR data from three FOVs, and the contrast may be at peak level for only 30 seconds. Therefore, it is proposed that sampling orders for each FOV acquisition be selected to sample the central region of k-space when the contrast is at its peak value. This means that data will be sampled along lines in k-space that are directed towards the central part. The drawbacks of sampling in the peripheral views of k-space which are not at peak value are thus compensated to a great extent.

Since the coil or coils used for the acquisition of the MRA data are at a fixed position with reference to the patient and the dimensions of the coil or coils are in the range of at least from 10 to 20 cm length and width, the spatial resolution of the image formed from the combination of successive FOVs will be reduced. On the other hand there may be aberrations and artefacts in vertical directions if a proper three-dimensional image is acquired. As is further indicated in the latter document, the sampling time may be too long in order to track a faster moving probe.

It is an object of the present invention to provide a method for forming a fast dynamic image of a moving RF probe which can be optimally tracked without any delay. Another object of the present invention is to provide a magnetic resonance apparatus for obtaining a fast dynamic image of a moving RF probe.

An essential advantage of the method for forming a fast dynamic image according to the present invention is that on the one hand an MR image over a combination of several FOVs with a high resolution can be obtained while on the other hand a bolus can be tracked along a vessel in real time without any delay. So depending on the aim, a high spatial resolution or a high temporal resolution can be achieved.

These and other objects of the invention are achieved by a method as defined in claim 1, by an apparatus as defined in claim 5 and by a computer program product as defined in claim 6.

Figure 2:
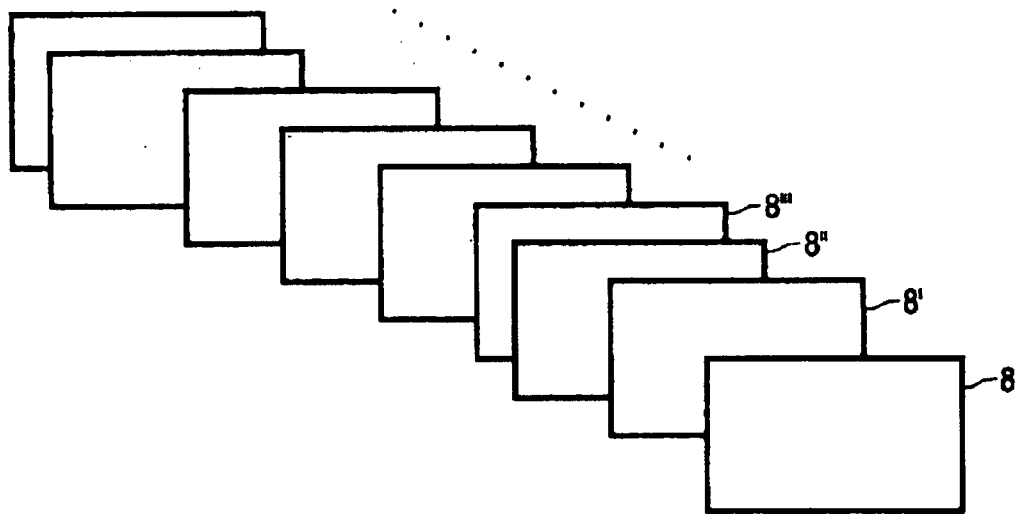
Figure 3:
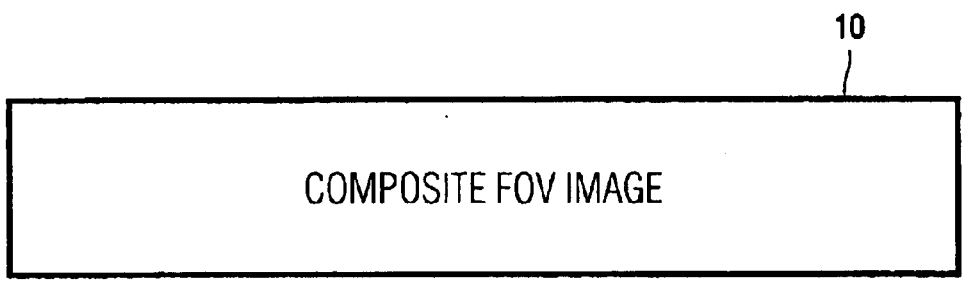
Figure 4:
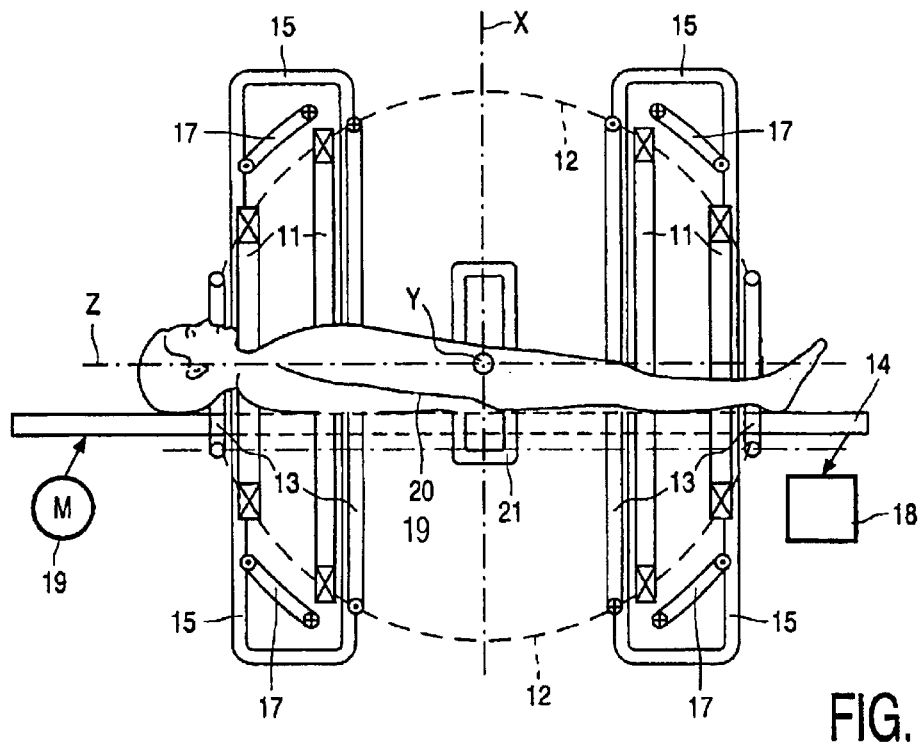
Figure 5:
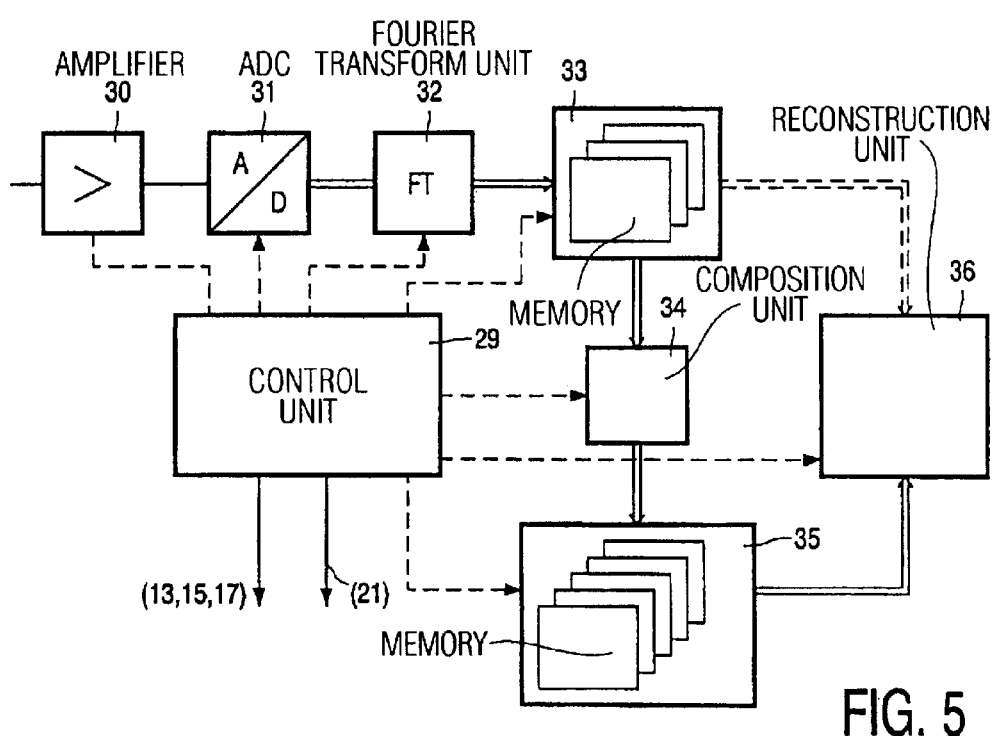

These and further advantages of the invention are disclosed in the dependent claims and in the following description in which an exemplified embodiment of the invention is described with reference to the accompanying drawings. Therein FIG. 1 shows diagrammatically a vessel and the positions of an RF coil moved along the vessel, FIG. 2 shows successive images with their shifted FOV, following the moving probe, FIG. 3 shows the image composed from the single images, FIG. 4 shows an apparatus for carrying out the method in accordance with the present invention, and FIG. 5 shows a circuit diagram of the apparatus shown in FIG. 4.

Unless mentioned otherwise specific numbers dedicated to elements defined with respect to a particular figure will be used consistently in all figures.

FIG. 1 shows a vessel 1 in the patient's body that will be tracked by an RF antenna, designed as an RF coil 2 that is moved in subsequent positions 3, 3', 3", 3'", etc., along the vessel 1 in order to track an RF probe 4 or contrast agent within the vessel 1. The initial scan is set up at the initial position 3 of the RF coil 2 such that the field-of-view or FOV is centered at the position of the probe 4. Alternatively, a set of initial scans can be performed starting with an oversized FOV which will be reduced over subsequent scans so as to be positioned with its center at the position of the RF probe 4.

The subsequent semi-continuous scans at the subsequent positions 3', 3", 3'" etc. are performed while the probe 4 is moved relative to the body of the patient, that is within the vessel 1. After each scan, when the probe 4 has been shifted relative to the current position of the FOV, the imaging field will be shifted within the FOV. This is detected automatically by processing software which inter alia estimates the noise boundaries when shrinking the FOV boundaries from the different sides of the FOV, or alternatively estimates the point of gravity of the signal distribution across the FOV. Subsequently, the FOV can be shifted accordingly for the next image to the estimated last position of the RF probe 4.

The above method can be performed in two or three dimensions for single-slice scans or multiple-slice scans. For a single slice scan, for example, parallel to the skin of the patient's body, not only the in-plane shift due to the repositioning of the probe can be calculated, but from the change in total signal sensitivity one can also estimate whether repositioning of the slice perpendicular to the slice plane is required. For a multiple slice or 3D scan the offset for the third dimension can be calculated using similar techniques as for the in-plane shift.

Additionally, subsequent images are also averaged when the FOV position was not changed in order to increase the signal-to-noise ratio. Alternatively, when the probe 4 has been moved and therefore subsequent images 8, 8' 8", 8'" etc. are acquired at different FOV positions (compare FIG. 2), a composite image 10 will be generated with an extended artificial FOV as depicted schematically in FIG. 3. The composite FOV image 10 can grow in its coverage with each new FOV position, so that a running image or track of the RF probe 4 can be obtained within a short time frame, the FOV being each time updated according to the last position of the RF probe 4.

Obviously, the approach as described above can be applied both to an RF probe moving relative to the patient as well as to an object moving relative to the RF probe.

In practice the RF coil 2 is designed as a ring of approximately 55 mm in diameter which can be used to scan about 10 frames per second. Such a coil 2 enables a considerable improvement of the spatial resolution of the image. However, if a better temporal resolution is pursued, which could be required, for example if a catheter within a vessel is to be tracked, the size of the voxels within the FOV will be enlarged. If an RF ring coil 2 of even smaller size is used, for example a ring with a diameter of approximately 20 mm, a much better spatial resolution can be obtained.

The apparatus as shown in FIG. 4 is an MR apparatus which comprises a system of four coils 11 for generating a steady, uniform magnetic field whose strength is of the order of magnitude of from some tenths of Tesla to some Tesla. The coils 11, being concentrically arranged relative to the z axis., may be provided on a spherical surface 12. The patient 20 to be examined is arranged on a table 14 which is positioned inside these coils. In order to produce a magnetic field which extends in the z direction and linearly varies in this direction (which field is also referred to hereinafter as the gradient field), four coils 13 are provided on the spherical surface 12. Also present are four coils 17 which generate a gradient field which also extends (vertically) in the x direction. A magnetic gradient field extending in the z direction and having a gradient in the y direction (perpendicularly to the plane of the drawing of FIG. 4) is generated by four coils 15 which may be identical to the coils 17 but are arranged so as to be offset 90° in space with respect thereto. Only two of these four coils are shown in. FIG. 4.

Because each of the three coil systems 13, 15, and 17 for generating the magnetic gradient fields is symmetrically arranged relative to the spherical surface, the field strength at the centre of the sphere is determined exclusively by the steady, uniform magnetic field of the coils 11. Also provided is an RF coil 21 which generates an essentially uniform RF magnetic field which extends perpendicularly to the direction of the steady, uniform magnetic field (i.e. perpendicularly to the z direction). The RF coil receives an RF modulated current from an RF generator during each RF pulse The RF coil 21 can also be used for receiving the spin resonance signals generated in the examination zone. In the present case the RF coil 21 is identical to the single flat ring coil 2 as described with reference to FIG. 1 which will be moved manually to the probe position.

The MR signals received in the MR apparatus are amplified by a unit 30 and transposed in the baseband. The analog signal thus obtained is converted into a sequence of digital values by an analog-to-digital converter 31. The analog-to-digital converter 31 is controlled by a control unit 29 so that it generates digital data words only during the read-out phase. The analog-to-digital converter 31 is succeeded by a Fourier transformation unit 32 which performs a one-dimensional Fourier transformation over the sequence of sampling values obtained by digitization of an MR signal, execution being so fast that the Fourier transformation is terminated before the next MR signal is received.

The raw data thus produced by Fourier transformation is written into a memory 33 whose storage capacity suffices for the storage of several sets of raw data which are equivalent to the images provided by the RF coil 2 at the position of the successive FOVs. From these sets of raw data a composition unit 34 generates the composite FOV image 10 in the described manner, which image is stored in a memory 35 whose storage capacity suffices for the storage of a large number of successive composite images 10. These sets of data are calculated for different instants, the spacing of which is preferably small in comparison with the measurement period required for the acquisition of a set of data. A reconstruction unit 36, performing a composition of the successive FOV images in the described manner, produces MR images from the sets of data thus acquired, said MR images being stored. The MR images represent the examination zone at the predetermined instants. The series of MR images thus obtained from the data suitably reproduces the dynamic processes in the examination zone.

The units 30 to 36 are controlled by the control unit 29. As denoted by the downwards pointing arrows, the control unit also imposes the variation in time of the currents in the gradient coil systems 13, 15 and 17 as well as the central frequency, the bandwidth and the envelope of the RF pulses generated by the RF coil 21. The memories 33 and 35 as well as the MR image memory (not shown) in the reconstruction unit 36 can be realized by way of a single memory of adequate capacity. The Fourier transformation unit 32, the composition unit 34 and the reconstruction unit 36 can be realized by way of a data processor that is suitable for running a computer program according the above mentioned method.

In the embodiment described above the method of the invention was used to enable reproduction of a dynamic process, such as a contrast medium injection, with improved temporal resolution. However, the method is also suitable for enhanced reproduction of an object which is moved relative to the examination zone, for example a patient during introduction into the examination zone. For this introduction process the method of the invention produces a series of images with improved spatial resolution in the direction of introduction.

To this end, there is provided an electric drive 19 for continuous displacement of the table top in its longitudinal direction (in the z direction), preferably at a constant speed. If the progression in time of the table top transport is not constant or not known in advance, the table top drive must be coupled to a sensor that supplies a signal corresponding to the position z of the table top. This sensor is denoted by the reference 18 in FIG. 4. Alternatively, the patient 20 or the table 14 may be kept stationary and the coil 2 may be moved along the skin of the patient commensurate the travel of the RF probe within the body, that is the vessel 1 (see FIG. 1).

What is claimed is:

1. A magnetic resonance method for forming a fast dynamic image from a plurality of signals from an RF probe, wherein the RF probe is moving relative to an object to be imaged, and wherein the plurality of signals are acquired in at least two adjacent fields of view (FOV) and that are reconstructed so as to form an image of a region of interest that includes the at least two adjacent FOVs, said method comprising:

scanning the object to be imaged with a moving RF coil antenna;

centering a first FOV of the at least two adjacent FOVs at a position of the RF probe;

determining a position of an imaging field within the actual FOV after each scan;

computing, from the determined position data, an estimated next position of the RF probe relative to the object;

moving the RF coil antenna to the estimated next position of the RF probe if the imaging field runs out of an actual FOV, so that a subsequent FOV of the at least two adjacent FOVs is centered again at the RF probe position; and generating a composite image from successive images of different ones of the at least two adjacent FOVs.

2. The magnetic resonance method as claimed in claim 1, further comprising:

performing a set of initial scans that starts with an oversized FOV and a subsequent reduced FOV, the next position of the RF probe being computed therefrom and the subsequent reduced FOV being centered at the estimated next position of the RF probe.

3. The magnetic resonance method as claimed in claim 2, wherein the oversized FOV is larger than the sensitive area of the moving RF coil antenna, preferably twice as large.

4. A magnetic resonance method as claimed in claim 3, wherein the RF coil antenna is a surface coil.

5. A magnetic resonance imaging apparatus for obtaining a fast dynamic image of an object from a plurality of signals, comprising:

an array of multiple sensors for recording signals, means for scanning the object along phase encoding trajectories, calculating means for reconstructing an image from signals recorded by sensors of different spatial positions with respect to the object to be imaged in order to obtain a fast dynamic image, a single RF coil antenna that is movable with respect to the object to be scanned, means for centering a FOV at an initial position of an RF probe within the object to be scanned, means for determining a position of an imaging field within the actual FOV after each scan, means for estimating a next position of the RF probe as a function of the position of the imaging field after each scan, a monitor for imaging an actual FOV to facilitate a moving of the RF coil antenna to the estimated next position of the RF probe if the imaging field runs out of the actual FOV, such that the subsequent FOV is centered at a subsequent RF probe position, and means for forming a composite image from successive images of the various adjacent FOVs.

6. A computer program product stored on a computer usable medium for forming a fast dynamic image by means of the magnetic resonance method, comprising a computer readable program means for causing the computer to control the execution of:

a procedure for recording signals from an array of multiple sensors a procedure for scanning an object along phase encoding trajectories, a calculating procedure for reconstructing an image from signals recorded at different spatial positions with respect to the object to be imaged in order to obtain a fast dynamic image, a procedure for positioning a single RF coil antenna at an actual RF probe position within the object to be scanned, a procedure for centering a FOV at the actual RF probe position, a procedure for determining a position of an imaging field within the actual FOV after each scan, a procedure for estimating a next position of the RF probe, a procedure for monitoring an imaging of the actual FOV to facilitate a moving of the RF coil antenna to the estimated next position of the RF probe if the imaging field runs out of the actual FOV, such that the subsequent FOV is centered at a subsequent RF probe position, and a procedure for forming a composite image from the successive images of the various adjacent FOVs.

\* \* \* \* \*